United States Patent [19]

Weiss

[11] Patent Number: 5,629,652

[45] Date of Patent: May 13, 1997

[54] BAND-SWITCHABLE, LOW-NOISE VOLTAGE CONTROLLED OSCILLATOR (VCO) FOR USE WITH LOW-Q RESONATOR ELEMENTS

[75] Inventor: Frederick G. Weiss, Newberg, Oreg.

[73] Assignee: Analog Devices, Corvallis, Oreg.

[21] Appl. No.: 647,395

[22] Filed: May 9, 1996

[51] Int. Cl.[6] ............................. H03B 5/00; H03B 5/20; H03B 27/00

[52] U.S. Cl. .................. 331/108 B; 331/45; 331/113 R; 331/135; 331/173; 331/179; 331/177 V

[58] Field of Search ................. 331/36 R, 36 C, 331/36 L, 45, 96, 101, 102, 107 A, 108 B, 108 C, 108 D, 113 R, 117 FE, 117 D, 135–137, 173, 179, 181, 177 V

[56] References Cited

U.S. PATENT DOCUMENTS

| | | | |
|---|---|---|---|
| 2,556,296 | 6/1951 | Rack | 331/135 |
| 3,775,696 | 11/1973 | Garth | 331/179 X |
| 4,779,063 | 10/1988 | Nagaoka | 331/135 |

Primary Examiner—David Mis
Attorney, Agent, or Firm—Marger, Johnson, McCollom & Stolowitz, PC

[57] ABSTRACT

Both differential and single-ended band-switchable VCOs are described. The single-ended version of the voltage controlled oscillator in its most basic form includes a load, two transistors, two delay elements, and a switchable current source. The first transistor includes a collector, an emitter and a base coupled to the load to form an output terminal for providing an oscillator output signal. The first delay element is connected between the collector and the base of the first transistor. The second transistor includes a collector, an emitter and a base connected to the base of the first transistor. The second delay element is connected between the collector of the first transistor and the collector of the second transistor. The switchable current source is connected to the emitters of the first and second transistors to provided a current to one of the transistors responsive to a control signal wherein the oscillator output signal has a first frequency of oscillation that is inversely proportional to the delay of the first transistor when the first transistor is turned on and a second frequency of oscillation inversely proportional to the sum of the first and second delay element delays when the second transistor is turned on.

49 Claims, 8 Drawing Sheets

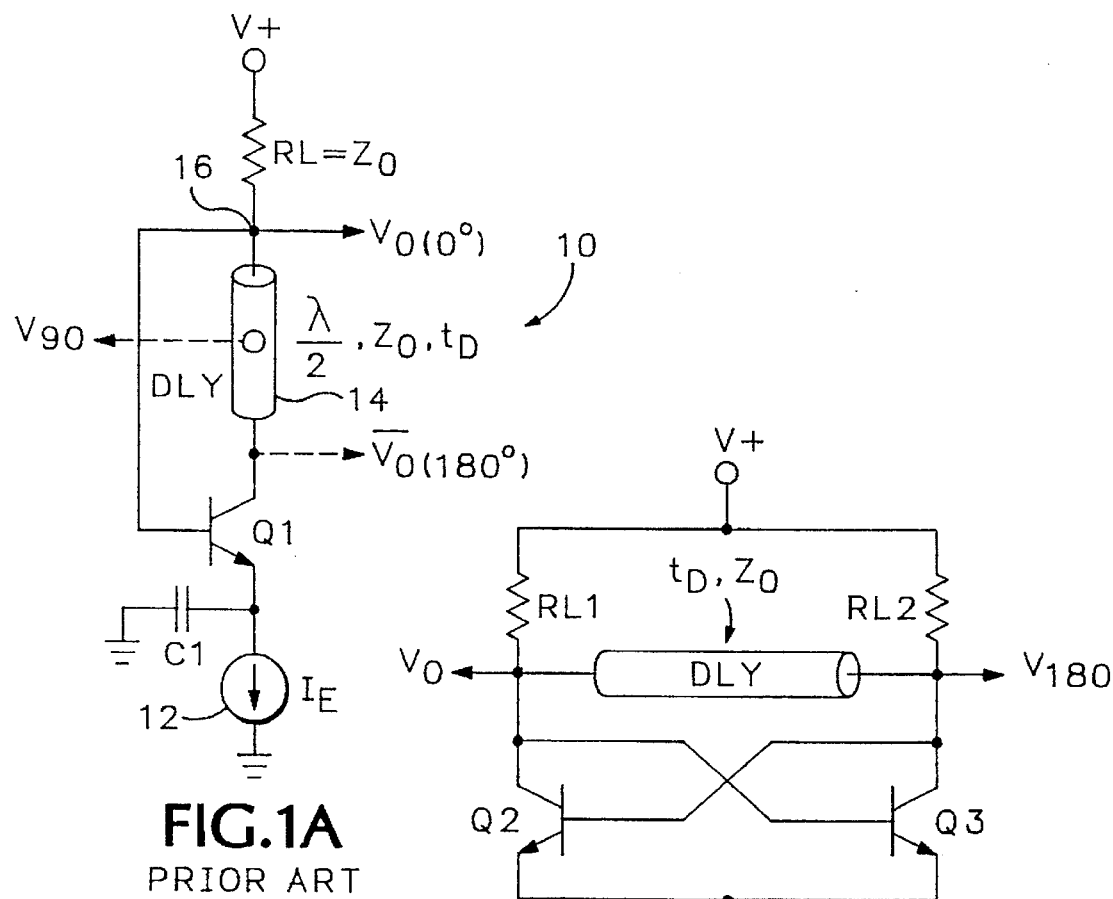
FIG.1A PRIOR ART
FIG.1B PRIOR ART
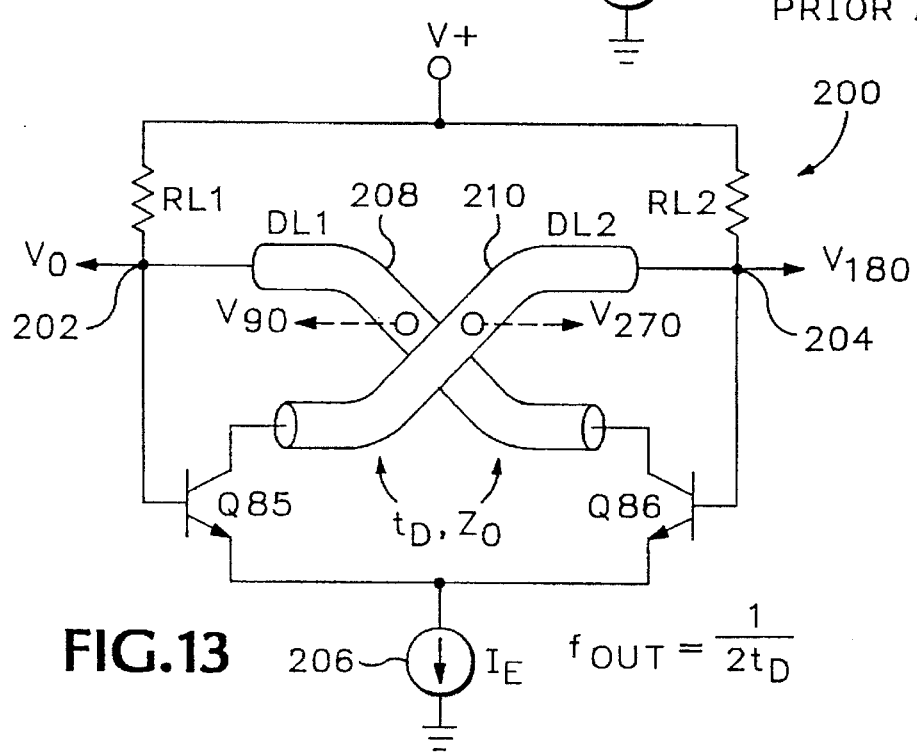
FIG.13

5,629,652

BAND-SWITCHABLE, LOW-NOISE VOLTAGE CONTROLLED OSCILLATOR (VCO) FOR USE WITH LOW-Q RESONATOR ELEMENTS

BACKGROUND OF THE INVENTION

This invention relates generally to oscillators and more particularly to voltage controlled oscillators (VCO).

The generation of a sine wave of a given frequency is an important building block upon which many circuits are based. Examples of these circuits include radio receivers and transmitters employing mixers to translate the frequency of an information-bearing signal. There are two basic approaches to the design of sine wave generators. The first is to design a non-linear oscillator, which generates square or triangular waveforms, and apply the waveform to a sine wave-shaper, which usually consists of diodes and resistors. These non-linear oscillators are also referred to as function generators. The second approach employs a positive-feedback loop that contains a frequency-selective network. The loop is designed to have a gain of unity at a single frequency determinedly the frequency selective network. In this type of oscillator, called a "linear oscillator," sine waves are generated essentially by a resonance phenomenon. This application deals with this latter approach.

An example of a linear oscillator is shown in FIG. 1A. The oscillator, shown generally at 10, includes a bipolar junction transistor (BJT) Q1 biased by a current source 12 and loaded by a load resistor $R_O$. The oscillator includes a delay line 14 interposed between the load resistor and the collector of transistor Q1. The base of Q1 is then connected to an output terminal 16 thereby forming a loop with the delay line 14 and the collector to base junction of the Q1. The delay line 14 has a time delay or, alternatively, a wavelength, which is selected to correspond to one-half the period of oscillation of a sinusoidal voltage $V_O$ produced on output terminal 16. The other one-half of the period is produced by inverter-connected transistor Q1, thus satisfying the oscillator criteria, i.e., unity gain and 360 degrees of phase shift.

Although discrete delay lines can be used as shown above, a more common approach is to use a L-C tank circuit such as shown in FIG. 2 to produce the delay. Oscillator 30 of FIG. 2 includes two inductors $L_1$ and $L_2$ and two varactors CR1 and CR2, though fixed capacitors can also be used in place of varactors if tuning is not required. The two L's and two C's form a single tank circuit having an equivalent inductance and equivalent capacitance. Varactors CR1 and CR2 are used in the tank circuit so that the frequency of oscillation can be modulated by a tuning voltage $V_{TUNE}$ applied to control terminal 32. The variable capacitance of the varactors provides some fine-tuning of the oscillator frequency. The oscillator 30 is commonly referred to as a voltage controlled oscillator (VCO).

One limitation of the oscillator 30 is that the frequency of oscillation can only be tuned over a very small range because of the limitations of the varactors. The oscillator 40 shown in FIG. 3 overcomes the limitation of the tuning range of oscillator 30 by including multiple varactors CR1–CR3 that are switched into the oscillator circuit responsive to respective control currents $I_{SW1}$–$I_{SW3}$. Each varactor CR1–CR3 has a different nominal capacitance so as to provide a unique base frequency for the oscillator when that particular varactor is enabled by the corresponding control current. The varactors, therefore, each provide a unique frequency band of oscillation. The frequency of oscillation can then be tuned within that band by modulating the tuning voltage $V_{TUNE}$ applied to a tuning input 42. With proper selection of the varactors, the oscillator 40 can provide a substantially continuous frequency range that greatly exceed that of oscillator 30 shown in FIG. 2. Conversely, a single varactor can be made to work in concert with a multiplicity of inductors to achieve the same result.

A characteristic of all of these oscillators is that their phase noise is only as good as the Q of the components that comprise the delay elements, i.e., the inductors and varactors. This presents a particular problem for integrated or monolithic circuits because it is difficult to achieve high Q inductors and varactors. For example, a typical on-chip inductor has a Q of approximately two to three, but a Q of approximately 50 is typically needed for adequate phase noise. Varactors have better Q's than inductors when formed on-chip, but are still inadequate for low phase noise.

An obvious solution is to provide these components in their discreet form and place them off-chip. There are several drawbacks to this approach. First is cost. The cost of providing additional external components adds to the expense of manufacturing the oscillator, not only in terms of direct materials costs, but also in terms of support and service, because of the added failures due to the manufacturing and placement of these additional parts. These additional components also consume precious real estate on a printed circuit board which may increase the form factor of the resultant product.

There are also mechanisms that compromise the Q of these off-chip solutions as well. The first is the interconnect bond wire resistance, which is a major contributor. Second is the external parasitics between the chip package and the external component. For the band switchable oscillator shown in FIG. 3, the resistance of switches (CR4, CR5, CR6) used to select the varactors appear in series with the varactors and therefore compromise the Q of those elements. For these reasons, a need remains for a fully integrated variable frequency oscillator with low phase noise.

SUMMARY OF THE INVENTION

It is, therefore, an object of the invention to overcome the limitations described above of prior art oscillators.

There are two aspects to the present invention. The first is a high-Q delay element that can be used in linear oscillators to improve their phase noise performance. The high-Q delay element according to the invention is made up of a plurality of individual delay sections. Although the Q of each section is not that high, when these sections are placed in series to form the delay element, the overall Q of the delay element increases proportional to the square root of the number of sections. In its most simple form, each section includes two parallel capacitors with an inductor connected therebetween. These capacitors can be made into varactors thereby allowing the delay of the element to be modulated in response to a control or tuning signal. These delay elements can then be used in any oscillator topology to provide the desired delay.

In the second aspect of the invention, several new oscillator topologies are discussed which provide for bandswitching, but that do not compromise the Q of the delay element as in the prior art. In particular, there is no additional resistance interjected into the signal path due to the switching element, because the transistor of the oscillator itself is used to perform the switching. In this new topology, a plurality of delay elements are connected in series. One of the delay elements has a delay that corresponds to the minimum frequency of oscillation. Each successive delay element has a delay, in the preferred embodiment, of only a fraction of this first delay. This fraction is chosen to correspond to the tunable range of the variable delay elements so that the oscillator has a substantially continuous frequency spectrum.

The topology is implemented in two basic forms. The first is a single-ended version. This version includes N delay elements connected in series and N transistors, each biased mutually exclusively by a current source. The collector of each transistor is connected to a node formed by the connection of two adjacent delay elements. The bases are connected together and to the output terminal of the oscillator to form N loops where each loop comprises a single collector-base junction and all of the delay elements between the collector of the respective transistor and the output terminal. Thus, each loop contains a unique combination of delay elements. A desired sine wave can then be generated by enabling the transistor of the corresponding delay combination.

A fully differential version of the invention is also described which includes a plurality (N in general) of cross-coupled transistor pairs such as that shown in FIGS. 1B and 2. Each cross-coupled pair has a pair of input terminals and an output terminal. A current source is coupled to the output terminals of the transistor pairs to provide a bias current to a desired one of the pairs in a mutually exclusive fashion based on the desired frequency of oscillation. A first one of the cross-coupled pairs (called the inner pair) has a first delay element connected by its respective input terminals. This delay element establishes the maximum frequency of oscillation when the first pair is enabled. A second pair of cross-coupled transistors is placed in parallel with the first pair and two additional delay elements are added. One of additional delay elements is connected between one of the output terminals of the second pair of transistors and a corresponding output terminal of the first pair. The other additional delay element is connected between the other output of the second pair of transistors and the corresponding output of the first pair. Each additional pair of cross-coupled transistors can be connected in a similar fashion to the adjacent pair until all N pairs of cross-coupled pairs are connected, which requires 2N-1 delay elements. The output terminals of the outermost pair forms the output terminals of the oscillator.

The differential version operates on the same basic principle as the single-ended version. Only one of the pairs is enabled at a time and the pair selected determines the frequency of oscillation of the circuit. In the preferred embodiment the first delay has a delay ($t_D$), which establishes the maximum frequency of oscillation ($f_{MAX}$). Each of the additional delays has only a fraction of the first delay (i.e., $\Delta t_D$). In this way fixed frequency bands can be selected by selecting the appropriate cross-coupled pair. Additional vernier tuning can be provided by using varactors to form the delay elements. The variability of the varactor capacitance can be chosen so as to span the frequency from one band to adjacent bands thereby providing a substantially continuous frequency spectrum of oscillation.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIG. 1A is a schematic drawing of a prior art, single-ended oscillator.

FIG. 1B is a schematic drawing of a prior art, differential oscillator using only a single delay element.

FIG. 13 is a schematic drawing of a differential oscillator having quadrature outputs according to the invention.

DETAILED DESCRIPTION

Figure 2:
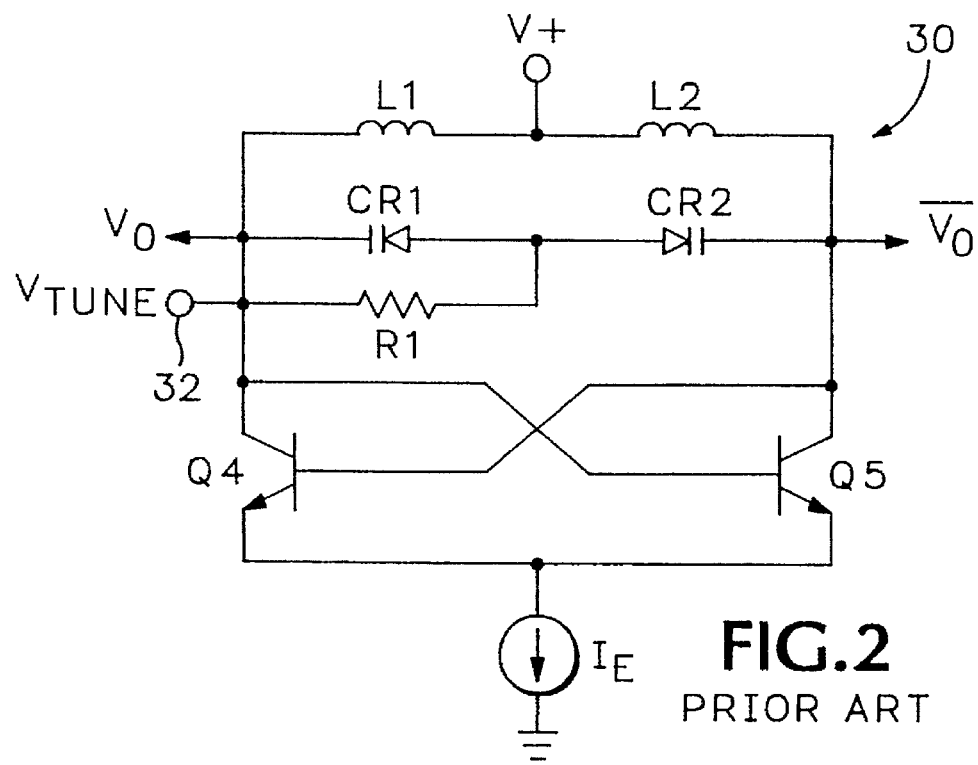
FIG. 2 is a schematic drawing of a prior art differential oscillator using an L-C tank circuit.
Figure 3:
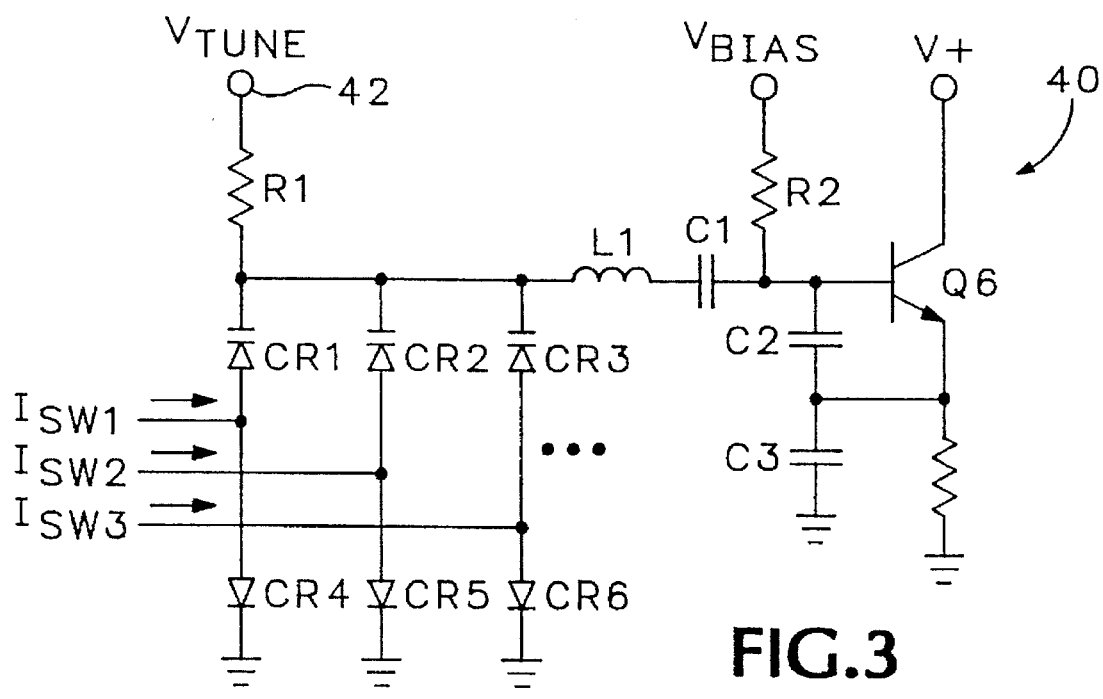
FIG. 3 is a schematic drawing of a prior art, band-switchable oscillator.
Figure 4:
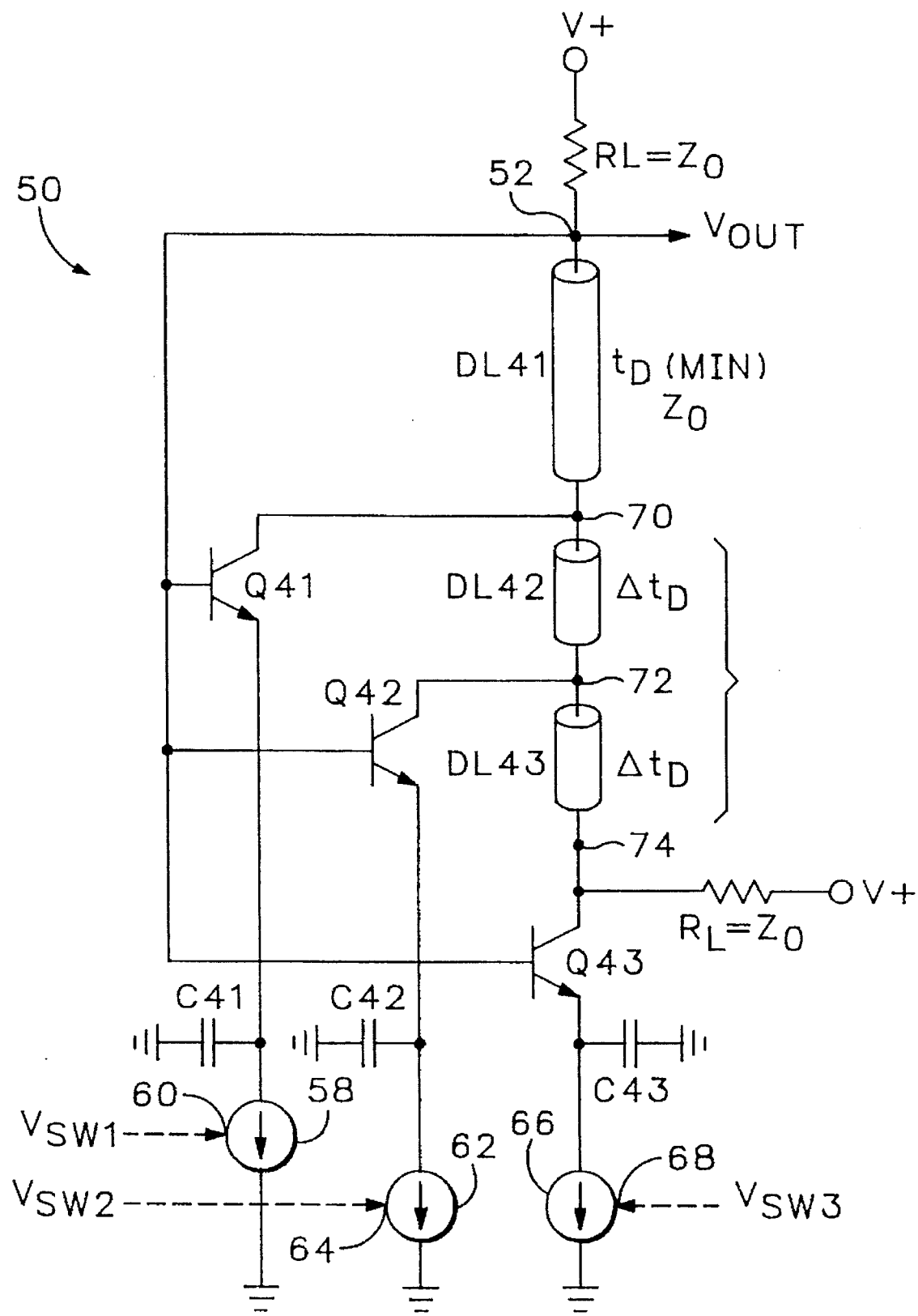
FIG. 4 is a schematic drawing of a band-switchable single-ended oscillator according to the invention.

Referring now to FIG. 4, a single-ended band-switchable oscillator according to the invention is shown generally at 50. The oscillator 50 includes three delay elements DL41, DL42 and DL43 connected in series. Although only three delay elements are shown, as will be apparent by the following description, the oscillator can be extended in general to include N delay elements. To simplify the drawing and the explanation, however, only three delay elements are shown. In the preferred embodiment, delay element DL41 has a delay $t_D$ that corresponds to the maximum desired frequency of oscillation. The subsequent delay elements DL42 and DL43 each have a delay that is only a fraction ($\Delta t_D$) of the delay of the first delay element DL41. Each of these fractional delays forms a unique frequency band beneath the maximum frequency of oscillation established by the first delay element DL41. By selecting the delays in this manner, a plurality of fixed frequency bands can be formed. The first delay element DL41 also has an impedance $Z_0$ that is approximately equal to the impedance of a load resistor $R_L$ connected between an output terminal 52 and a supply voltage rail V+. The impedances $R_L$ and $Z_0$ are matched to minimize reflections from both ends of the line.

The oscillator 50 also includes three transistors Q41, Q42 and Q43. In the preferred embodiment, these transistors are bipolar junction transistors (BJT's), but the invention is not limited thereto. Each transistor is biased by a switchable current source that provides a bias current thereto responsive to a control signal received at the current source. Current source 58 is connected to the emitter of transistor Q41 and has a control input 60 to which a control signal $V_{SW1}$ is applied. This control signal $V_{SW1}$ turns the current source 58 either off or on depending upon the state of the signal. When the current source is on the current flows through the transistor Q41 thereby enabling the transistor. Similarly, a current source 62 is connected to the emitter of transistor Q42. The current source 62 also includes a control input 64 to which the control signal $V_{SW2}$ is applied. The current source 62 operates in an identical manner to that to current source 58 except responsive to the control signal $V_{SW2}$. Likewise, transistor Q43 is selectively biased by current source 66 responsive to control signal $V_{SW3}$ received on control input 68.

The collector of each transistor is connected to one or more of the delay elements. The collector of Q41 is connected to node 70 formed between delay elements DL41 and DL42; the collector of Q42 is connected to node 72 between delay elements DL42 and DL43; and the collector of Q43 is connected to node 74 formed by the connection of the collector and delay element DL43. The bases of the three transistors are connected together and further connected to output terminal 52 on which an output oscillator voltage signal $V_{OUT}$ is produced. Capacitors C41, C42, and C43 provide AC return paths for Q41, Q42, and Q43, respectively.

The oscillator 50 operates as follows. Only one of the three transistors is turned on at any one time. The other transistors are turned off. The transistor that is turned on is determined by the desired frequency of oscillation. Once the transistor is turned on, a loop is formed with the transistor and one or more of the delay elements, depending on which transistor is turned on. For example, if transistor Q41 is turned on, and transistors Q42 and Q43 are turned off, a loop is formed with delay element DL41 and transistor Q41 acting as an inverting amplifier. The choice of emitter current, which sets the transconductance (gm) of Q41, and $Z_0$ (and hence $R_L$) combine to give a net gain around the loop of greater than unity. This satisfies one of the criteria for oscillator startup. The other condition, i.e., a net phase around the loop of 360 degrees, is met by the inverting characteristics of Q41 (180 degree phase shift) and the 180 degrees of phase shift due to the active delay line section. This selection causes the oscillator 50 to oscillate at its maximum frequency of oscillation, which is inversely proportional to twice the delay of the delay element DL41, i.e., $f_{MAX}=\frac{1}{2}t_D$ (MIN).

If, on the other hand, transistor Q42 is turned on and transistors Q41 and Q43 are turned off, a loop is formed with delay elements DL41 and DL42 and transistor Q42 acting as an inverter. This produces a second frequency of oscillation corresponding to a delay equal to the sum of the delays of delay elements DL41 and DL42, i.e., $t_D+\Delta t_D$. Thus, a new frequency is generated below the maximum frequency of oscillation which has a frequency of oscillation equal to $1/[2(t_D+\Delta t_D)]$.

Finally, if transistor Q43 is turned on or enabled and the other two transistors Q41 and Q42 are turned off, a new loop is formed with delay elements DL41, DL42 and DL43 and transistor Q43. Yet a third frequency of oscillation is produced thereby, which is inversely proportional to the sum of the delays of delay elements DL41, DL42 and DL43. It should be apparent that this topology can be extended in general to N delay elements to provide a plurality of frequency bands of oscillation. However, it is not necessary that the incremental delay of each additional stage be identical. As will be described further below, each of the delay elements can be tunable across its corresponding band to thereby provide a substantially continuous frequency spectrum for the oscillator.

Figure 5:
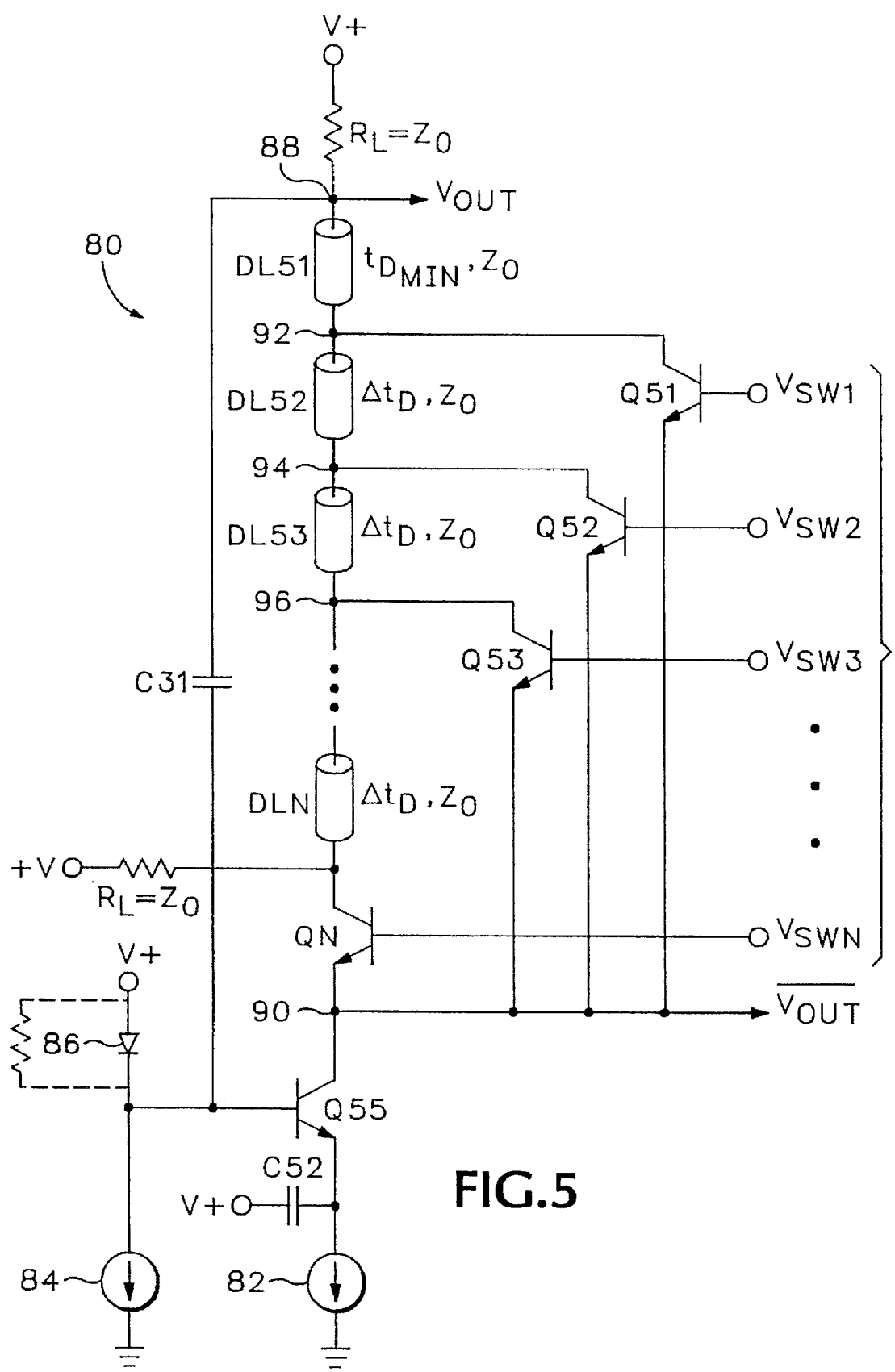
FIG. 5 is a schematic diagram of a band-switchable differential oscillator according to the invention.

Referring now to FIG. 5, another implementation of a band switchable oscillator according to the invention is shown generally at 80. The oscillator 80 uses the same basic topology in that a plurality of delay elements DL51-DLN are connected in series, each connected to a respective transistor Q51-QN, respectively. The ends of the line are terminated in a load $R_L$ equal to $Z_0$. A capacitor C31, however, closes the loop, allowing a DC potential to exist between VOUT and the base of Q55, while at the same time completing the loop in an AC sense. Capacitor C52, on the other hand, acts to establish an AC ground at the emitter of Q55. The operation of the transistors Q51-QN are mutually exclusive, i.e., only one is operational at a time. The transistors Q51-QN do not provide any phase shift as did the transistors Q41–Q43 of FIG. 4. Instead, transistors Q51-QN act solely to bypass the downstream delay elements. The necessary phase shift is provided by transistor Q55, which is biased by a current source 82 connected to the emitter thereof and a diode (or alternatively resistor) 86 connected between the supply rail voltage V+ and its base. A second current source 84 is also connected between the base of transistor Q55 and ground to ensure that diode 86 is maintained in its forward conduction operation.

The oscillator 80 includes a differential pair of outputs 88 and 90 across which a differential oscillator output signal ($V_{OUT}$) is produced. The frequency of oscillation of this signal is a function of which delay element or elements is currently in the loop. This is, in turn, determined by which of the plurality of transistors is enabled. The base of each transistor Q51-QN forms a control input to which a respective control signal ($V_{SW1}$-$V_{SWN}$) is applied. When the respective control signal is pulled to the positive supply rail, V+, and all others are held at a level at least 100 mv lower, the transistor forms an effective short thereby bypassing all of the downstream elements. For example, when control signal $V_{SW1}$ is pulled high (i.e., asserted) and the other control signals $V_{SW2}$-$V_{SWN}$ are pulled low (i.e., deasserted), transistor Q51 is turned on and transistors Q52-QN are turned off. By turning transistor Q51 on, node 92 is effectively shorted to output terminal 90. A loop is thus formed with the delay element DL51, the inverting amplifier transistor Q55 and capacitor C31. The delay of delay element DL51 determines the frequency of oscillation of the resulting oscillator signal, which is the maximum frequency signal of the oscillator 80 equal to $f_{MAX}=\frac{1}{2}t_D$.

Similarly, if control signal $V_{SW2}$ is asserted and control signals $V_{SW1}$, $V_{SW3}$-$V_{SWN}$ are deasserted, transistor Q52 is turned on and transistors Q51, Q53-QN are turned off. This, in effect, takes transistors Q51, Q53-QN out of the circuit, because they are in a high impedance state. With transistor Q52 thus turned on, a loop is formed, in effect, with delay elements DL51 and DL52, transistor Q55 and the capacitor C31. Transistor Q52 is also included in the loop, however, its effect is minimal. Configured in this way, the oscillator 80 oscillates at a second frequency of oscillation, which is less than the first frequency of oscillation set by delay element DL51. In the preferred embodiment, the delay of each of the delay elements is equal so that the incremental changes in the frequency of oscillation are equal although this is not of fundamental importance to the operation of the device. The impedance of each is also approximately equal. As with oscillator 50 of FIG. 4, oscillator 80 can be extended in general to N delay elements (and corresponding bypass transistors) as indicated by the notation in FIG. 5 (i.e., DLN, QN, $V_{SWN}$). If only a single delay element (and corresponding bypass transistor) is used, the bypass transistor acts as a cascode transistor and the control signal (e.g., $V_{SW1}$) simply acts to establish the correct bias. Each delay element can also be tunable to thereby provide a substantially continuous frequency spectrum.

Figure 6:
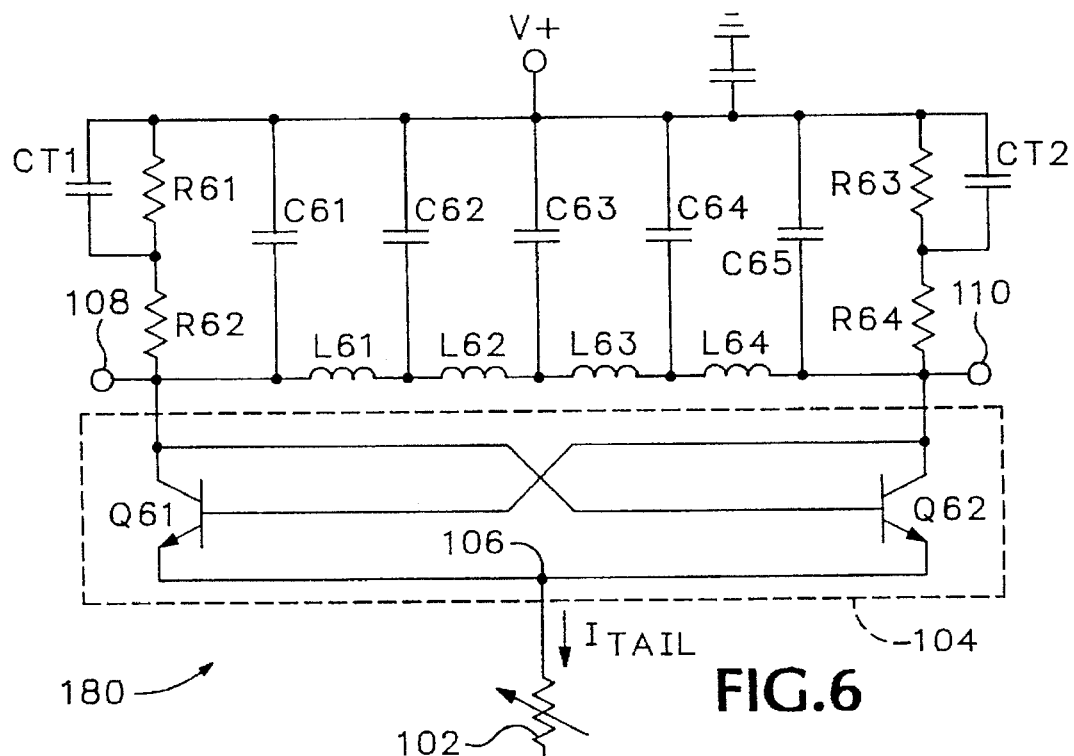
FIG. 6 is a schematic drawing of the oscillator shown in FIG. 1B using a plurality of L-C sections according to the invention.

Referring now to FIG. 6, another oscillator 100 according to the invention is shown. This oscillator includes a cross-coupled pair of transistors 104 such as that shown in FIG. 1B. The cross-coupled pair includes transistors Q61 and Q62 where the collector of each is connected to the base of the opposite transistor. The emitters are connected together to form a common emitter node 106 that is connected to a variable current source 102, which provides a tail current $I_{TAIL}$ to the cross-coupled pair.

The oscillator 100 also includes an L-C circuit comprised of a plurality of L-C sections, together forming a lumped equivalent of delay line DLY in FIG. 1B. Each section includes two capacitors and an inductor connected therebetween. The L-C circuit shown in FIG. 6 includes four such L-C sections. The first section includes capacitor C61 and C62 with inductor L61 connected between the two capacitors. The ends of the capacitors opposite the inductors are connected to an AC ground node, i.e., the supply rail V+ in this case. The next section includes capacitors C62 and C63 with inductor L62 connected between the two capacitors. The other two sections are similarly configured. It should be apparent that each capacitor, with the exception of the outer-most capacitors (C61 and C65) are shared between two adjacent L-C sections. The effective impedance of the lumped-element line is given by the familiar relationship:

$$Z_0 = \sqrt{(L/C)}$$

and the delay of each section is $$t_D = \sqrt{(1/LC)}.$$

The net delay is then $Nt_D$, where N is equal to the number of sections (e.g., four).

At each end of the L-C circuit is a pair of termination resistors connected in series. A first pair R61 and R62 are connected in series between the supply rail V+ and a first output terminal 108. Each resistor, in the preferred embodiment, is approximately 25 ohms so as to provide a 50 ohm termination to the delay line, whose characteristic impedance is assumed to be 50 ohms. An additional capacitor $C_{t1}$ is also connected in parallel with resistor R61. Similarly, a second pair of resistors R63 and R64 is connected in series between the supply rail V+ and a second output terminal 110. As with the other pair, the two resistors R63 and R64 form a 50 ohm output impedance. A capacitor $C_{t2}$ is connected in parallel with resistor R63. The capacitors $C_{t1}$ and $C_{t2}$ form high-pass filters to roll off the network's response so oscillations will not occur at integer multiples of the fundamental frequency.

The advantage of using a delay line comprised of a plurality of L-C sections connected in series is that the effective Q of the L-C circuit increases with the square root of the number of L-C sections, which can be expressed as follows:

$$Q_{NET} = Q_{SECTION} \times \sqrt{n},$$

where n is equal to the number of L-C sections comprising the delay line; and $Q_{SECTION}$ is equal to the Q of an individual L-C section. This is important since the Q of a typical integrated (on chip) inductor is only 3-6, or possibly 10 only with elaborate processing.

Thus, by using a plurality of sections, a low noise oscillator can be achieved on a monolithic circuit using existing process technology. The L-C sections can also be used in the band-switchable embodiments shown herein so as to increase the tuning range of the oscillator.

Figure 7:
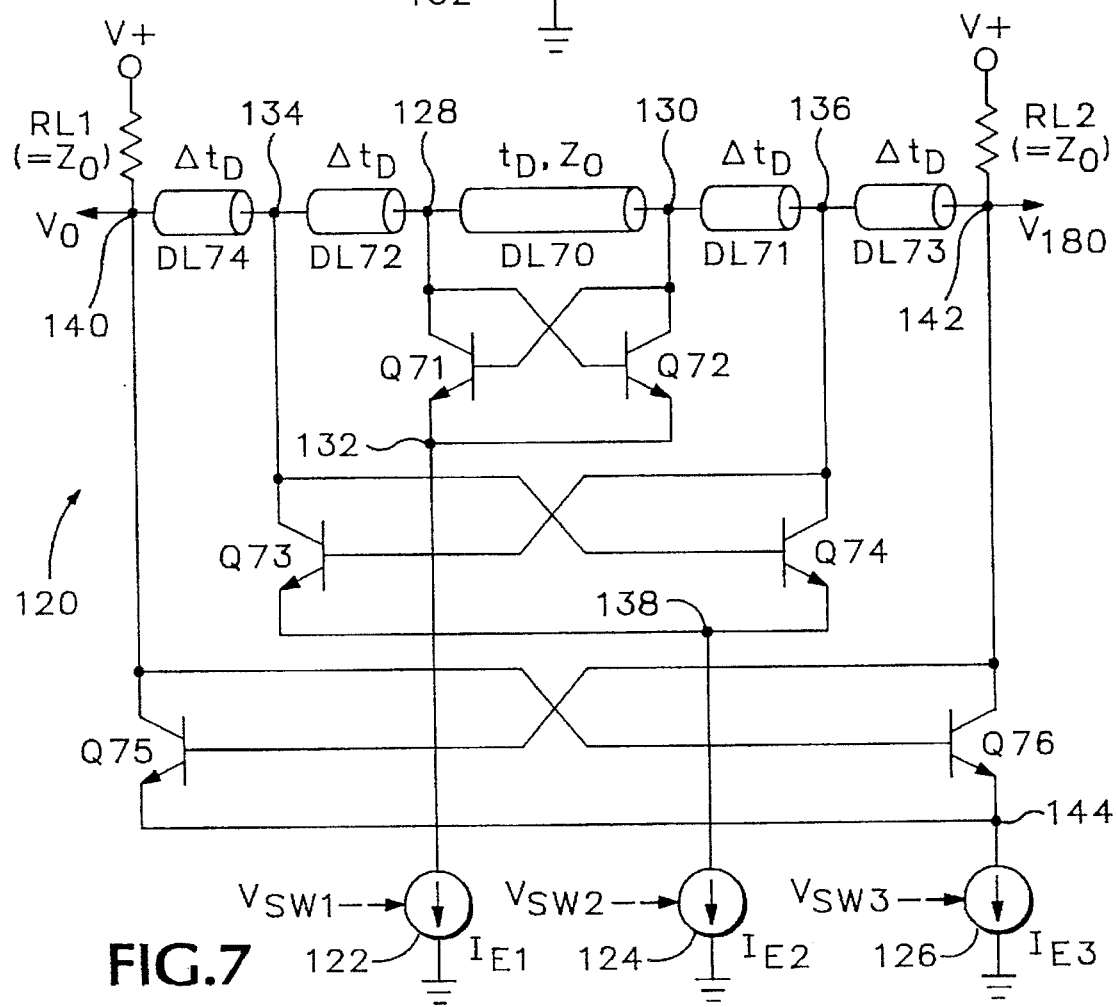
FIG. 7 is a schematic drawing of a second embodiment of a band-switchable differential oscillator according to the invention.

Referring now to FIG. 7, a band-switchable, low-noise oscillator is shown generally at 120. Oscillator 120 includes three cross-coupled pairs of transistors. The first pair includes transistors Q71 and Q72, the second includes transistors Q73 and Q74, and the third includes transistors Q75 and Q76. Although oscillator 120 is shown having three pairs of cross-coupled to transistors, as will become apparent below, the oscillator 120 can be extended in general to N pairs of cross-coupled transistors.

Each pair of cross-coupled transistors is connected to a respective switchable current source, which provides a current thereto responsive to a control signal supplied to the respective current source. These current sources 122, 124 and 126 operate in substantially the same manner as current sources 58, 62 and 68 described above with reference to FIG. 4. Accordingly, they are not discussed further. The first pair of cross-coupled transistors Q71 and Q72 includes a first collector node 128 connected to the collector of Q71 and the base of Q72. The pair also includes a second collector node 130 connected to the collector of Q72 and the base of Q71 thereby creating the cross-coupled relationship. The emitters of transistors Q71 and Q72 are connected to a common emitter node 132 that is connected to current source 122 to receive a switchable current therefrom responsive to the control signal $V_{SW1}$. A first delay element DL70 is connected between the two collector nodes 128 and 130.

Cross-coupled pair of transistors Q73 and Q74 similarly include a first collector node 134 connected to the collector of Q73 and the base of Q74 and a second collector node 136 connected to the collector of Q74 and to the base of Q73. The emitters of Q73 and Q74 are connected to a common emitter node 138, which is connected to a current source 124 to receive the switchable current therefrom responsive to the control signal $V_{SW2}$. A second delay element DL72 is connected between the first collector nodes 128 and 134 of the first and second pairs of cross-coupled transistors, respectively. Similarly, a third delay element DL71 is connected between the second collector nodes 130 and 136 of the first and second pairs of cross-coupled transistors, respectively.

The oscillator 120 further includes a third pair of cross-coupled transistors Q75 and Q76. The third pair includes a first collector node 140 connected to the collector of Q75 and the base of Q76 and a second collector node 142 connected to the collector of Q76 and to the base of Q75. The third pair also includes a common emitter node 144 connected to both emitters and to the third current source 126. A fourth delay element DL74 is connected between the first collector nodes 134 and 140 of the second and third pairs of cross-coupled transistors, respectively. Similarly, a fifth delay element DL73 is connected between the second collector nodes 136 and 142 of the second and third pairs of cross-coupled transistors, respectively.

Also connected to the first collector node 140 is a first load resistor $R_{L1}$, which is connected between the node 140 and the supply rail V+. On the opposite side of the oscillator, a second load resistor $R_{L2}$ is connected between the supply rail V+ and the second collector node 142. Collector nodes 140 and 142 therefore form a differential output of the oscillator 120 across which a differential oscillator signal is generated.

The oscillator 120 switches between bands in much the same way as the oscillator in FIG. 4. If the first pair of cross-coupled transistors Q71 and Q72 are activated by enabling the corresponding current source 122, the other two pairs are disabled by deasserting the corresponding control signals. Once the first pair is activated, the gain of the cross-coupled pair (the transconductance) operates into the delay line impedance $Z_0$ and establishes a net gain around the loop in excess of unity. Likewise, the phase inversion through the cross-coupled pair and the time delay of DL70 combine to produce a net 360 degree phase change around the loop. Together the gain and phase satisfy the starting conditions for an oscillator. As the amplitude of oscillation increase, a point is reached at which the swing at the collectors limits and a steady-state condition is established wherein the average gain over the period of one cycle is unity in the presence of a net phase shift of 360 degrees around the loop.

At steady-state, an output signal is generated across nodes 140 and 142, which has a frequency of oscillation inversely proportional to twice the delay of the delay element DL70. Even though the oscillation signal is generated across collector nodes 128 and 130, the signal propagates out through the other (equal) delay elements to the nodes 140 and 142 in a symmetrical fashion. If the impedance of the delay element DL70 is chosen to be approximately equal to that of the load resistors $R_{L1}$ and $R_{L2}$, there will be little-to-no reflection. Note that the signals at nodes 140 and 142 maintain a 180 degree phase relationship, even though separated in time from 128 and 130.

If the middle pair of cross-coupled transistors is turned on and the other two pairs are turned off, the frequency of the output signal of the oscillator is inversely proportional to twice the sum of the delays of delay elements DL70, DL71 and DL72 because it is these elements that are now inside the loop formed with the second pair of cross-coupled transistors. The final case, where the third pair of cross-coupled transistors Q75 and Q76 are turned on and the first and second pair are turned off, all of the delay elements DL70–DL74 are included in the loop. Therefore, the oscillator has a frequency of oscillation that is inversely proportional to the twice sum of the delays of all the delay elements ($t_{DL70-DL74}$). In the preferred embodiment, the first delay element DL70 is chosen to correspond to the maximum frequency of oscillation. Each of the remaining delays (DL71–DL74) have only a fraction of the delay of the first delay element ($\Delta t_D$). In that case, the frequency of oscillation can be expressed in terms of these two delays as a function of the control signals as shown in the table below.

TABLE 1

| | Oscillator frequency as a function of switch setting. | | |
|---|---|---|---|
| $V_{SW1}$ | $V_{SW2}$ | $V_{SW3}$ | FREQUENCY |
| ON | OFF | OFF | $1/(2 \times t_D)$ |
| OFF | ON | OFF | $1/[2 \times (t_D + 2\Delta t_D)]$ |
| OFF | OFF | ON | $1/[2 \times (t_D + 4\Delta t_D)]$ |
| OFF | OFF | OFF | 0 |

Figure 8:
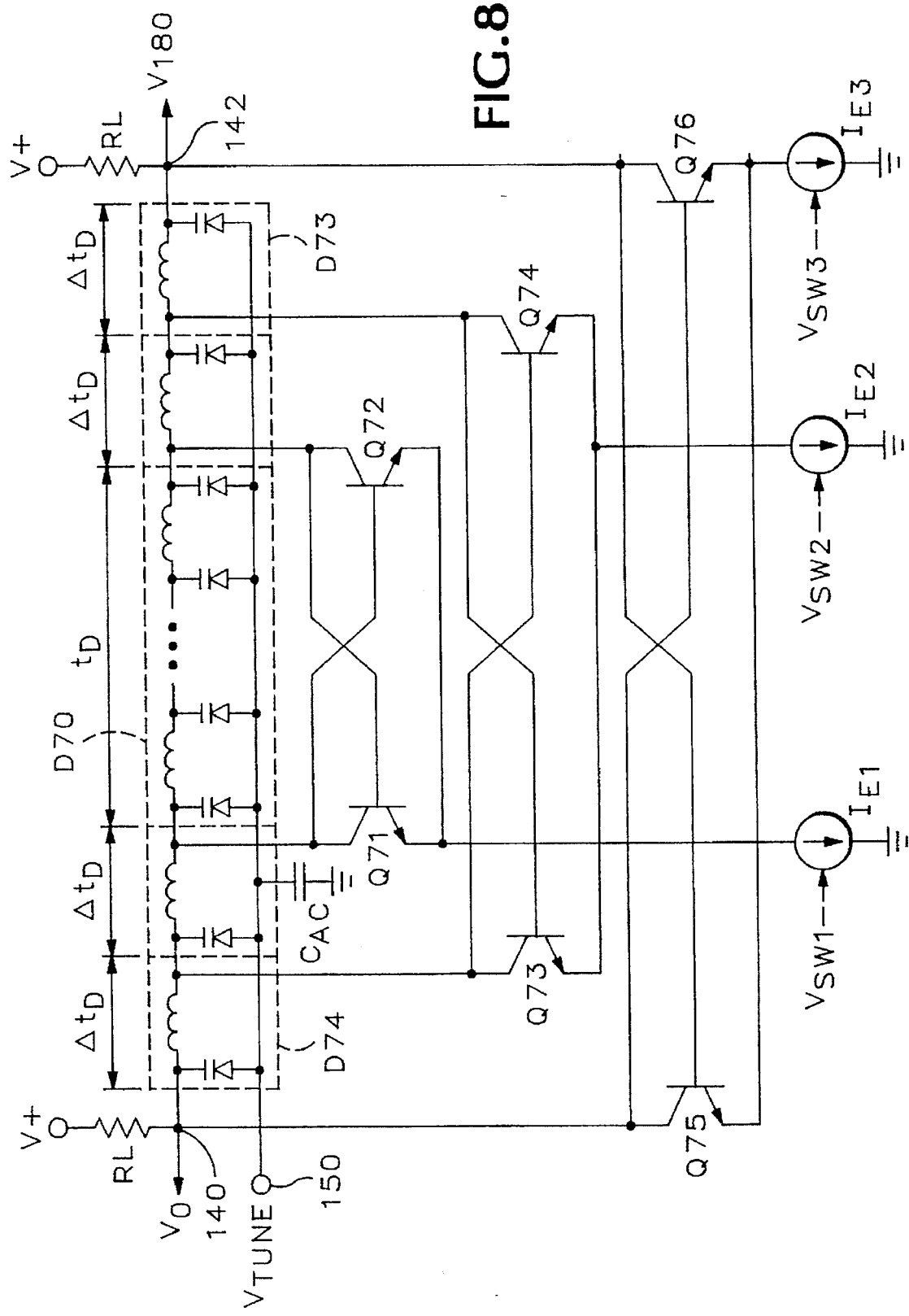
FIG. 8 is a schematic drawing of the band-switchable differential oscillator of FIG. 7 using a plurality of L-C sections according to the invention.

Referring now to FIG. 8, a tunable version of the oscillator 120 is shown. The delay elements have been replaced with L-C circuits according to the topology of FIG. 6, with the additional use of varactors in place of fixed capacitors which allow the oscillator's frequency to be tuned responsive to a tuning signal $V_{TUNE}$ applied to a tuning input 150. Delay element DL70, as described above, is comprised of a plurality (n) of L-C sections. This raises the Q of the overall L-C circuit over the individual L-C sections by a factor of the square root of n. Each of the other delay elements will generally only include a single L-C section comprised of two varactors in parallel with an inductor connected therebetween, though the use of more than one L-C section in the switched delay elements may be advantageous in some applications and is certainly allowed by the topology. All of the varactors are connected to the tuning input 150 to receive the tuning voltage. The varactors are chosen so that the oscillator can be tuned from one frequency band to the next by adjusting the tuning voltage through its entire tuning range. Thus, the oscillator shown in FIG. 8 provides both low-phase noise and a substantially continuous frequency spectrum. The tunable oscillator of FIG. 8 operates in substantially the same manner as does the oscillator of FIG. 7 and will therefore not be described further.

Figure 9:
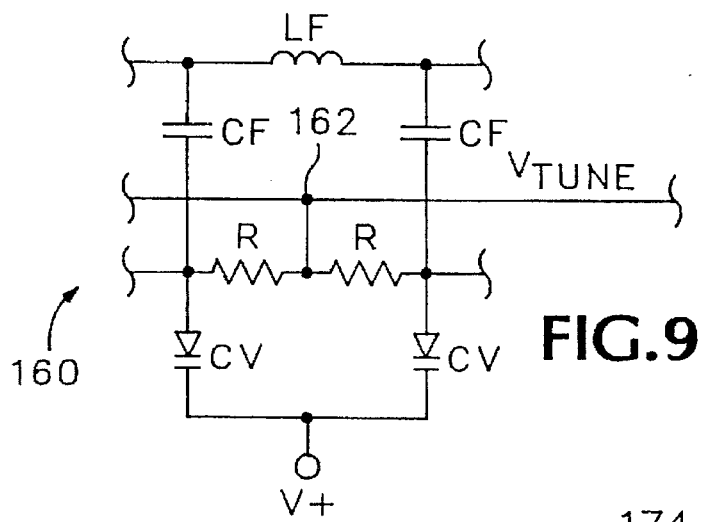
FIG. 9 is a schematic diagram of a tunable L-C delay section according to the invention.

Another embodiment of an L-C section capable of being used in the oscillator of FIG. 7 is shown in FIG. 9. The L-C section shown generally at 160 includes two parallel branches, where each branch includes a fixed capacitor $C_F$ in series with a varactor $C_V$. An inductor $L_F$ is connected between the two fixed capacitors at the opposite sides of the inductor to form the input nodes of the L-C section to which adjacent L-C sections are connected. A tuning node 162 is connected to the center points of the two branches via two identical resistors R. The tuning voltage $V_{TUNE}$ is then applied to this tuning node to vary the capacitance of the varactors and thereby tune the frequency of the oscillator. For lower noise, resistors R may be replaced with inductors which offer low DC-resistance but a high impedance at the oscillator frequency.

Figure 10:
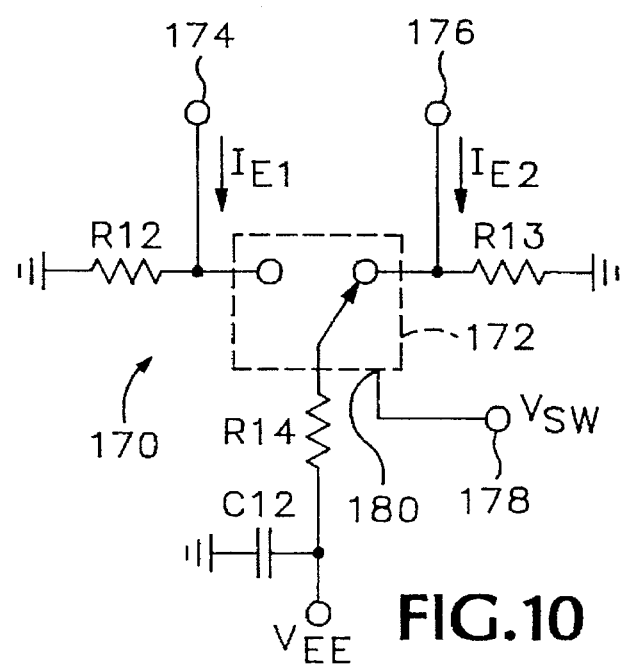
FIG. 10 is a schematic diagram of a switchable current source that can be used in conjunction with the band-switchable oscillators according to the invention.
Figure 11:
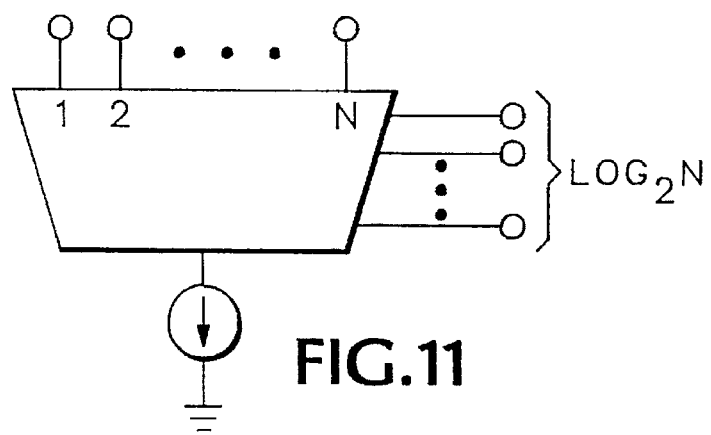
FIG. 11 is a block diagram of a switchable current source that can be used in conjunction with the band-switchable oscillators according to the invention.
Figure 12:
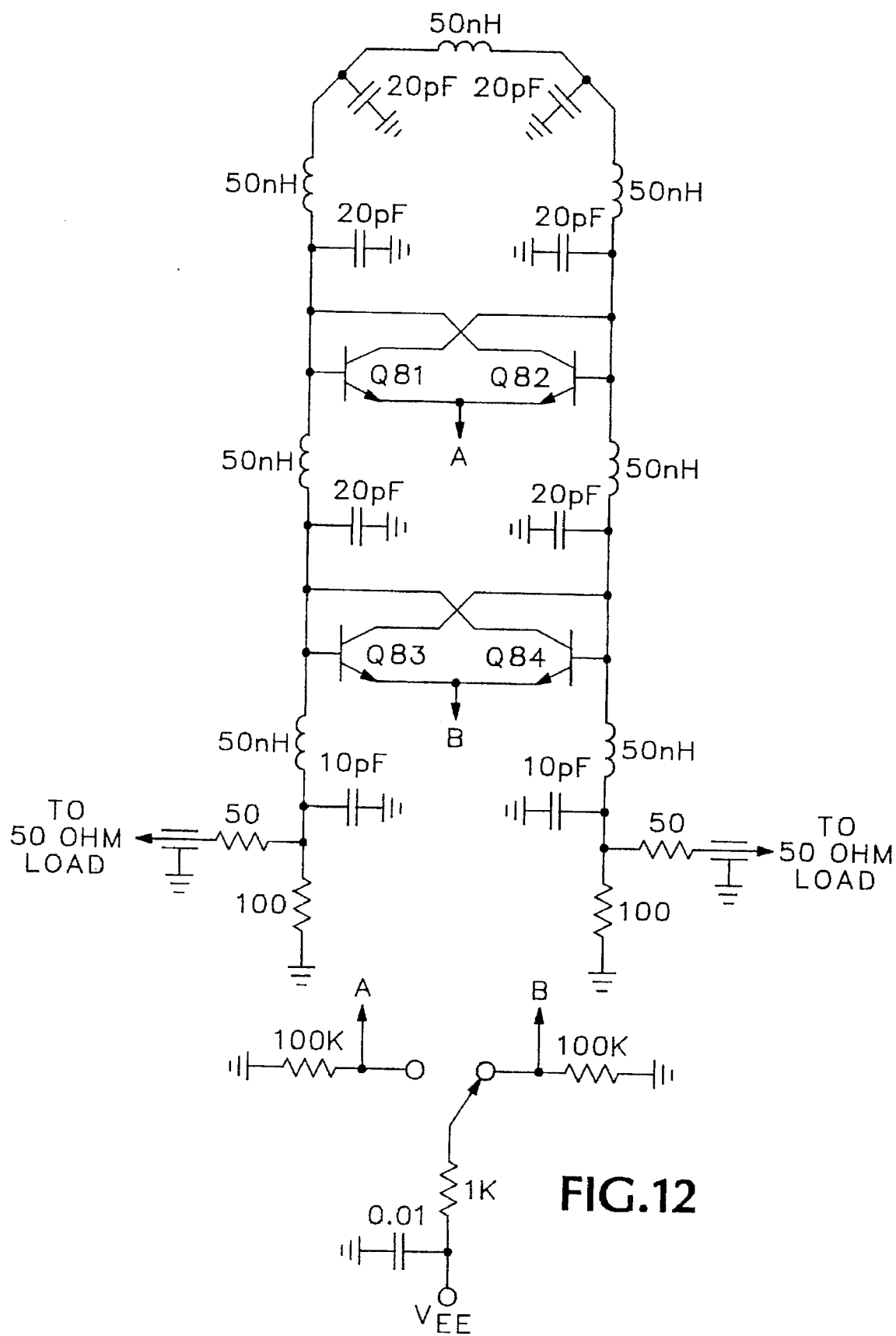
FIG. 12 is a practical embodiment of a differential oscillator according to the invention.

Referring now to FIG. 10, a different embodiment of a switchable current source capable of being used in conjunction with the oscillators according to the invention is shown. The current sources that drive either the individual transistors in the single ended versions (FIG. 4) or the pairs of cross-coupled transistors in the differential versions (FIGS. 7–8) are shown above as individual current sources each having a unique control signal for actuating that current source. The current sources need not be implemented in that way. Because only a single current is required for any given frequency, a single current source can be used, which can be multiplexed between the various transistors or pairs of transistors, whichever the case may be. An example of this approach is shown in FIG. 10 where only two transistors or two pairs of transistors (for the differential case) are required. In this case, a resistor R14 is connected between a switch 172 and a negative supply voltage rail $V_{EE}$. This forms a rudimentary current source. The switch 172 switches between two outputs 174 and 176 responsive to a control signal $V_{SW}$ applied to a control input 178. The control input 178 is connected to a select input 180 of the switch 170. The state of the signal appearing on the select input 180 causes the switch to move between one of the two switch positions. Thus, switch 172 operates as a multiplexer. An oscillator using this switchable current source is shown in FIG. 12. This approach can be extended in general to N stages as shown in FIG. 11. The number of control signals required to select one of N is equal to $\log_2 N$ as is known in the art.

Another embodiment of an oscillator according to the invention is shown in FIG. 13. The oscillator 200 produces a differential sinusoidal output voltage ($V_O$, $V_{180}$) on two output terminals 202 and 204. The oscillator includes a pair of transistors Q85 and Q86 whose emitters are connected to a current source 206, which provides a tail current thereto.

Instead of a single delay line as in FIG. 1A, the oscillator 20 includes two delay lines 208 and 210. Delay line 208 is connected between output terminal 202 and the collector of transistor Q86 while the delay line 210 is connected between output terminal 204 and the collector of transistor Q85. A respective resistor is connected between the supply rail V+ and the base of each transistor. Assuming each delay line has an equal delay ($t_D$), the frequency of oscillation is equal to the reciprocal of two times the delay through each delay line, i.e., $f_{OUT}=\frac{1}{2}t_D$. An advantage of this topology is the ability to generate a quadrature version ($V_{90}$, $V_{270}$) of the sinusoidal output. If the delay lines have taps at the midpoint of the delay, the quadrature version of the sinusoidal output signal can be produced. The delay lines can be implemented using any of the delay designs described above. In addition, the oscillator can be made band-switchable using the topologies described above.

Having described and illustrated the principles of the invention in a preferred embodiment thereof, it should be apparent that the invention can be modified in arrangement and detail without departing from such principles. Although the delay elements are described above to include a plurality of L-C sections in the preferred embodiment, the delay elements can take a variety of forms in the topologies described herein. For example, the delay elements can take the form of microstrips or even discrete delay lines. Moreover, the invention is not limited to bipolar junction transistors. Rather, equivalent versions of the oscillators can be constructed using MOS and junction field effect transistors, gallium arsenide transistors and a variety of other transistors in place of the bipolar junction transistors described above. I claim all modifications and variation coming within the spirit and scope of the following claims.

I claim:

1. A variable frequency oscillator comprising:

a load coupled between a first supply voltage terminal for receiving a first supply voltage and an output terminal;

a first transistor having a collector, an emitter coupled to a second supply voltage terminal for providing an AC return path, and a base coupled to the output terminal for providing an oscillator output signal;

a first delay element connected between the output terminal and the collector of the first transistor, the first delay element having a first delay;

a second transistor having a collector, an emitter coupled to the second supply voltage terminal for providing an AC return path, and a base connected to the base of the first transistor;

a second delay element connected between the collector of the first transistor and the collector of the second transistor, the second delay element having a second delay; and a switchable current source having a first output connected to the emitter of the first transistor, a second output connected to the emitter of the second transistor, and a control input for receiving a control signal, the switchable current source providing a current to the first transistor responsive to a first state of the control signal to turn on the first transistor and a current to the second transistor responsive to a second state of the control signal to turn on the second transistor, wherein the oscillator output signal has a first frequency of oscillation that is inversely proportional to the first delay when the first transistor is turned on and a second frequency of oscillation inversely proportional to the sum of the first and second delays when the second transistor is turned on.

2. A variable frequency oscillator according to claim 1 further comprising:

a third transistor having a collector, a base connected to the base of the first transistor, and an emitter coupled to the second supply voltage terminal to provide an AC return path and connected to a third input of the switchable current source to receive a current to turn on the third transistor; and a third delay element connected between the collector of the second transistor and the collector of the third transistor, the third delay element having a third delay, wherein the oscillator output signal has a third frequency of oscillation that is inversely proportional to the sum of the first, second, and third delays when the third transistor is turned on and the first and second transistors are turned off.

3. A variable frequency oscillator according to claim 1 wherein the first delay element includes an L-C section comprising:

an first capacitor having a positive and a negative terminal;

a second capacitor having a positive and a negative terminal connected to the negative terminal of the first capacitor to form a common node; and an inductor coupled between the positive terminals of the first and second capacitors.

4. A variable frequency oscillator according to claim 3 wherein the first delay element includes a plurality of L-C sections connected in series.

5. A variable frequency oscillator according to claim 3 wherein the second delay element includes a single L-C section.

6. A variable frequency oscillator according to claim 3 wherein the first and second capacitors are variable capacitors and the common node receives a tuning signal for tuning the delay of the first delay element.

7. A variable frequency oscillator according to claim 1 wherein the switchable current source includes:

a first current source coupled to the emitter of the first transistor, the first current source having a control terminal for receiving a first control signal, the first current source providing a current to the first transistor responsive to the first control signal to turn on the first transistor; and a second current source coupled to the emitter of the second transistor, the second current source having a control terminal for receiving a second control signal, the second current source providing a current to the second transistor responsive to the second control signal to turn on the second transistor.

8. A variable frequency oscillator according to claim 1 wherein the first and second transistors are Metal Oxide Semiconductor (MOS) transistors each having a drain corresponding to a collector, a gate corresponding to a base, and a source corresponding to an emitter.

9. A variable frequency oscillator comprising:

a first load coupled between a first supply voltage terminal for receiving a first supply voltage and a first differential output terminal;

a second load coupled between the first supply voltage terminal and a second differential output terminal;

a first pair of cross-coupled transistors having a first collector node, a second collector node, and a common emitter node, the first and second collector nodes forming a differential output for providing a differential oscillator output signal;

a first delay element connected between the first and second collector nodes of the first pair of cross-coupled transistors, the first delay element having a first delay;

a second pair of cross-coupled transistors having a first collector node coupled to the first differential output terminal, a second collector node coupled to the second differential output terminal, and a common emitter node;

a second delay element connected between the first collector nodes of the first and second pairs of cross-coupled transistors, the second delay element having a second delay;

a third delay element connected between the second collector nodes of the first and second pairs of cross-coupled transistors, the third delay element having a third delay; and a switchable current source having a first output connected to the common emitter node of the first pair of cross-coupled transistors, a second output connected to the common emitter node of the second pair of cross-coupled transistors, and a control input for receiving a control signal, the switchable current source providing a current to the second pair of cross-coupled transistors responsive to a first state of the control signal to turn on the first pair of cross-coupled transistors and a current to the second pair of cross-coupled transistors responsive to a second state of the control signal to turn on the second pair of cross-coupled transistors, wherein the oscillator output signal has a first frequency of oscillation that is inversely proportional to the first delay when the first pair of cross-coupled transistors are turned on and a second frequency of oscillation inversely proportional to the sum of the first, second and third delays when the second pair of cross-coupled transistors are turned on.

10. A variable frequency oscillator according to claim 9 wherein the second delay is equal to the third delay.

11. A variable frequency oscillator according to claim 9 wherein the second delay is a fraction of the first delay.

12. A variable frequency oscillator according to claim 9 wherein the switchable current source includes:

a first current source coupled to the common-emitter node of the first pair of cross-coupled transistors, the first current source having a control terminal for receiving a first control signal, the first current source providing a current to the first pair of cross-coupled transistors responsive to the first control signal to turn on the first pair of cross-coupled transistors; and a second current source coupled to the common emitter node of the second pair of cross-coupled transistors, the second current source having a control terminal for receiving a second control signal, the second current source providing a current to the second pair of cross-coupled transistors responsive to the second control signal to turn on the second pair of cross-coupled transistors.

13. A variable frequency oscillator according to claim 9 wherein the switchable current source includes:

a current source; and a multiplexer having a first input coupled to the current source, a first output coupled to the common emitter node of the first pair of cross-coupled transistors, a second output coupled to the common emitter node of the second pair of cross-coupled transistors, and a control input for receiving the control signal.

14. A variable frequency oscillator according to claim 9 wherein the first delay element includes an L-C section comprising:

a first capacitor having a positive and a negative terminal;

a second capacitor having a positive and a negative terminal connected to the negative terminal of the first capacitor to form a common node; and an inductor coupled between the positive terminals of the first and second capacitors.

15. A variable frequency oscillator according to claim 14 wherein the first delay element includes a plurality of L-C sections connected in series.

16. A variable frequency oscillator according to claim 14 wherein the second delay element includes a single L-C section.

17. A variable frequency oscillator according to claim 14 wherein the first and second capacitors are variable capacitors and the common node receives a tuning signal for tuning the delay of the first delay element.

18. A variable frequency oscillator according to claim 17 wherein the tuning signal tunes the frequency of oscillation of the oscillator output signal from the first frequency to the second frequency.

19. A variable frequency oscillator according to claim 9 further comprising:

a third pair of cross-coupled transistors having a first collector node coupled to the first differential output terminal, a second collector node coupled to the second differential output terminal, and a common emitter node connected to the switchable current source to receive a current to turn on the third pair of cross-coupled transistors;

a fourth delay element connected between the first collector nodes of the second and third pairs of cross-coupled transistors, the fourth delay element having a fourth delay; and a fifth delay element coupled between the second collector nodes of the second and third pairs of cross-coupled transistors, the fifth delay element having a fifth delay.

20. A variable frequency oscillator according to claim 19 wherein the second, third, fourth and fifth delays are equal.

21. A variable frequency oscillator according to claim 9 wherein the first delay element includes a continuously distributed delay line.

22. A variable frequency oscillator according to claim 9 wherein the first delay element includes a microstrip delay line.

23. A variable frequency oscillator according to claim 9 wherein the first pair of cross-coupled transistors include a pair of bipolar junction transistors.

24. A variable frequency oscillator according to claim 9 wherein the first pair of cross-coupled transistors include a pair of field effect transistors.

25. A variable frequency oscillator according to claim 9 wherein the first pair of cross-coupled transistors include a pair of gallium arsenide transistors.

26. A variable frequency oscillator comprising:

a load coupled between a first supply voltage terminal and a first output terminal;

a first transistor having a collector, an emitter coupled to an AC ground, and a base coupled to the first output terminal for providing an oscillator output signal of a first polarity;

a current source coupled to the emitter of the first transistor;

means for biasing the first transistor;

a second transistor having a collector, an emitter connected to the collector of the first transistor to form a second output terminal for providing an oscillator output signal of a second polarity, the second polarity being opposite the first polarity, the second transistor having a base forming a control terminal for receiving a first control signal, the second transistor being turned on responsive to the first control signal;

a first delay element connected between the first output terminal and the collector of the second transistor, the first delay element having a first delay, wherein the oscillator output signal has a frequency of oscillation that is inversely proportional to the first delay when the second transistor is turned on by the first control signal.

27. A variable frequency oscillator according to claim 26 further including:

a third transistor having a collector, an emitter coupled to the second output terminal, and a base forming a second control terminal for receiving a second control signal, the third transistor being turned on responsive to the second control signal;

a second delay element connected between the collector of the third transistor and the collector of the second transistor, the second delay element having a second delay, wherein the oscillator output signal has a second frequency of oscillation that is inversely proportional to the sum of the first delay and the second delay when the third transistor is turned on and the second transistor is turned off.

28. A variable frequency oscillator according to claim 27 further comprising:

a fourth transistor having a collector, an emitter connected to the second output terminal, and a base forming a third control terminal for receiving a third control signal, the fourth transistor being turned on responsive to the third control signal;

a third delay element connected between the collector of the third transistor and the collector of the fourth transistor, the fourth delay element having a fourth delay; and wherein the oscillator output signal has a third frequency of oscillation that is inversely proportional to the sum of the first, third and fourth delays when the third transistor is turned on and the second and fourth transistors are turned off.

29. A variable frequency oscillator according to claim 28 wherein the oscillator output signal has a fourth frequency of oscillation that is inversely proportional to the sum of the first and third delays when the fourth transistor is turned on and the second and third transistors are turned off.

30. A variable frequency oscillator according to claim 26 wherein the means for biasing the first transistor includes:

a second current source coupled to the base of the first transistor; and a load coupled between the first supply voltage terminal and the base of the first transistor.

31. A variable frequency oscillator according to claim 26 wherein the first delay element includes a delay line section comprising:

an inductor having a first input terminal at one end and a second input terminal at a second end, the first delay being measured across the first and second input terminals;

a first fixed capacitor coupled between the first input terminal and a first internal node;

a second fixed capacitor coupled between the second input terminal and a second internal node;

a first varactor coupled between the first internal node and the first supply voltage terminal;

a second varactor coupled between the second internal node and the first supply voltage terminal;

a first resistor coupled between the first internal node and a tuning input for receiving a tuning signal; and a second resistor coupled between the second internal node and the tuning input, wherein the first delay is variable responsive to the tuning signal.

32. A variable frequency oscillator according to claim 31 wherein the first delay element includes a plurality of delay line sections.

33. A variable frequency oscillator according to claim 32 wherein the second delay element includes a delay line section.

34. A variable frequency oscillator according to claim 26 further including:

a first capacitor interposed between the base of the first transistor and the first output terminal; and a second capacitor coupled between the emitter of the first transistor and an AC ground.

35. A variable frequency oscillator according to claim 26 wherein the first and second transistors are Metal Oxide Semiconductor (MOS) transistors each having a drain corresponding to a collector, a gate corresponding to a base, and a source corresponding to an emitter.

36. An oscillator comprising:

a first transistor having a base, a collector, and an emitter;

a second transistor having a base, a collector, and an emitter;

a current source coupled to the emitters of the first and second transistors;

a first load coupled between a first supply voltage terminal and the base of the first transistor to form a first output terminal for providing a first differential oscillator output signal;

a second load coupled between the first supply voltage terminal and the base of the second transistor to form a second output terminal for providing a second differential oscillator output signal;

a first delay element connected between the first output terminal and the collector of the second transistor, the first delay element having a first delay; and a second delay element connected between the second output terminal and the collector of the first transistor, the second delay element having a second delay equal to the first delay.

37. An oscillator according to claim 36 wherein the first delay element includes intermediate tap along the first delay; and wherein the second delay element includes an intermediate tap along the second delay.

38. An oscillator according to claim 37 wherein the intermediate taps of the first and second delay elements are at a center position of the delay elements so that one half of the delay lies on either side of the respective tap whereby a quadrature version of the differential oscillator output signal is produced across the intermediate taps of the first and second delay elements.

39. A method of generating a plurality of oscillation frequencies comprising the steps of:

providing an inverter;

providing a plurality of delay elements, each having a respective delay;

connecting each of the delay elements in series from a first delay element to a last delay element;

providing a plurality of switches, each switch associated with one of the delay elements;

closing one of the switches and opening all of the other of the switches thereby creating a loop that includes the inverter and all of the delays from the first delay to the delay associated with the closed switch; and providing an oscillator signal that has a frequency of oscillation inversely proportional to twice the sum of the delays of all the delay elements in the loop.

40. A method of generating a plurality of oscillation frequencies according to claim 39 wherein the step of providing a plurality of switches includes providing a plurality of transistors, each transistor acting as a respective switch.

41. A method of generating a plurality of oscillation frequencies according to claim 40 wherein the step of closing one of the switches and opening all of the other of the switches includes providing a current to the transistor acting as the closed switch and removing currents from all of the transistors acting as open switches.

42. A method of generating a plurality of oscillation frequencies according to claim 40 wherein the step of closing one of the switches and opening all of the other of the switches includes providing an asserted control signal to the transistor acting as the closed switch and providing deasserted control signals to all of the other transistors acting as open switches.

43. A method of generating a plurality of oscillation frequencies according to claim 40 wherein the step of providing a plurality of transistors includes the step of providing a plurality of bipolar junction transistors.

44. A method of generating a plurality of oscillation frequencies according to claim 40 wherein the step of providing a plurality of transistors includes the step of providing a plurality of metal oxide semiconductor (MOS) transistors.

45. A method of generating a plurality of oscillation frequencies according to claim 40 wherein the step of providing a plurality of transistors includes the step of providing a plurality of gallium arsenide transistors.

46. A method of generating a plurality of oscillation frequencies according to claim 39 wherein the step of providing a plurality of switches, each switch associated with one of the delay elements includes connecting the switch between two adjacent delay elements.

47. A method of generating a plurality of oscillation frequencies according to claim 39 wherein the step of providing a plurality of delay elements includes:

providing the first delay element with a first delay; and providing the other delay elements with a second delay.

48. A method of generating a plurality of oscillation frequencies according to claim 47 wherein the second delay is a fraction of the first delay.

49. A method of generating a plurality of oscillation frequencies according to claim 39 wherein the providing a plurality of delay elements includes providing a plurality of distributed delay elements.

* * * * *

UNITED STATES PATENT AND TRADEMARK OFFICE
CERTIFICATE OF CORRECTION

PATENT NO. : 5,629,652
DATED : May 13, 1997
INVENTOR(S) : Weiss

It is certified that error appears in the above-identified patent and that said Letters Patent is hereby corrected as shown below:

Column 16,
Line 13, "tuning - signal" should read -- tuning signal --

Signed and Sealed this

Second Day of April, 2002

Attest:

JAMES E. ROGAN
*Director of the United States Patent and Trademark Office*

*Attesting Officer*